United States Patent [19]
Tanaka et al.

[11] Patent Number: 5,255,223
[45] Date of Patent: Oct. 19, 1993

[54] SEMICONDUCTOR MEMORY DEVICE HAVING ALTERNATIVELY OPERATED EQUALIZING AND ERASING FUNCTIONS

[75] Inventors: Takayuki Tanaka; Shinya Takahashi; Yuki Hashimoto; Toshiharu Watanabe, all of Tokyo, Japan

[73] Assignee: Oki Electric Industry Co., Ltd., Tokyo, Japan

[21] Appl. No.: 731,337

[22] Filed: Jul. 17, 1991

[30] Foreign Application Priority Data

Jul. 23, 1990 [JP] Japan .................. 2-194666

[51] Int. Cl.$^5$ .......................... G11C 11/407
[52] U.S. Cl. .................. 365/189.09; 365/189.11; 365/203; 365/218
[58] Field of Search ............ 365/189.09, 189.11, 365/189.03, 203, 218

[56] References Cited

U.S. PATENT DOCUMENTS

| | | | |
|---|---|---|---|
| 4,656,608 | 4/1987 | Aoyama | 365/203 X |
| 4,780,850 | 10/1988 | Miyamoto et al. | 365/189 |
| 5,091,889 | 2/1992 | Hamano et al. | 365/203 X |

FOREIGN PATENT DOCUMENTS 0360526 3/1990 European Pat. Off. .
1057490 3/1989 Japan .

Primary Examiner—Siegfried H. Grimm
Attorney, Agent, or Firm—Spencer, Frank & Schenider

[57] ABSTRACT

In a semiconductor memory device comprising memory cells connected at the intersections of pairs of bit lines and word lines, sense amplifiers activated by the potentials on common nodes to amplify the potential differences between the respective pairs of the bit lines, an equalizing circuit activated by an equalizing signal to apply the potential on a power supply node to the pairs of bit lines, and a reference potential supplying circuit for generating a reference potential and supplying the reference potential to the power supply node through a switching circuit, a circuit is provided to block the application of the reference potential to the bit lines and the sense amplifier common nodes and to apply a negative potential to the bit lines. The word lines are held at the ground level, so the physical "0" is written into all the memory cells simultaneously.

13 Claims, 8 Drawing Sheets

SEMICONDUCTOR MEMORY DEVICE HAVING ALTERNATIVELY OPERATED EQUALIZING AND ERASING FUNCTIONS

FIELD OF THE INVENTION

The present invention relates to a semiconductor memory device, such as a dynamic random access memory device (DRAM) of a CMOS (complementary MOS transistor) configuration, and in particular to a semiconductor memory device having a function of simultaneously erasing all the stored information to the physical "0" level.

BACKGROUND OF THE INVENTION

A conventional semiconductor memory device of this type is shown in FIG. 1. Its configuration will now be described with reference to the drawings.

FIG. 1 is a circuit diagram showing an example of construction of a memory cell sense amplifier of the prior art DRAM.

In this DRAM, a plurality of pairs of bit lines (only two of them, BL1a and BL1b being shown) and a plurality of word lines (only two of them, WL1 and WL2 being shown) are provided, and at their intersections, memory cells (only two of them, 10-1 and 10-2 being shown) of a one-transistor type are connected. Each of the memory cells 10-1 and 10-2 comprises an enhancement-type n-channel MOSFET (NMOS transistor) 11 and a capacitor 12. The gates of the NMOS transistors 11 are connected to the word lines WL1 and WL2 and the drains and sources of the NMOS transistors 11 are connected between the bit lines BL1a and BL1b and the storage nodes Nm, and the capacitors 12 are connected between the storage nodes Nm and a node of a fixed potential $V_0$ (e.g., Vcc/2).

First and second sense amplifiers 21 and 22 are connected across each pair of the bit lines BL1a and BL1b. The first and the second sense amplifiers 21 and 22 are activated by a potential on the sense amplifier common nodes Nsn and Nsp. The first sense amplifier 21 is comprised of a flip-flop having two NMOS transistors 21a and 21b. The second sense amplifier 22 is comprised of a flip-flop having two enhancement-type p-channel MOSFETs (PMOS transistors) 22a and 22b.

Connected between the respective pairs of bit lines BL1a and BL1b are bit line equalizing sections 23. Each equalizing section 23 is activated by an equalizing signal EQ (e.g. of the power supply voltage Vcc), which sets the bit lines BL1a and BL1b to a potential on a power supply node Nv (e.g., Vcc/2), and comprises two NMOS transistor 23a and 23b connected in series between the bit lines BL1a and BL1b and are turned on and off by the equalizing signal EQ.

Connected between the sense amplifier common nodes Nsn and Nsp, and the power supply node Nv are common node precharging sections 24 which are turned on by the equalizing signal EQ to precharge the common nodes Nsn and Nsp. The precharging section 24 has NMOS transistors 24a and 24b turned on and off by the equalizing signal EQ, and the NMOS transistor 24a is connected between the power supply node Nv and the common node Nsn, while the NMOS transistor 24b is connected between the power supply node Nv and the common node Nsp.

Connected to the power supply node Nv is a reference potential generator 25. This reference potential generator 25 generates a reference potential, e.g., of ½ of the power supply potential Vcc supplied from the outside of the DRAM, and supplies it to the power supply node Nv.

The reading operation and the writing operation of FIG. 1 will now be described with reference to FIG. 2.

First, the reading operation is described.

During the stand-by period (mode), the equalizing signal EQ is High (=Vcc), the NMOS transistors 23a and 23b are turned on, and the bit lines BL1a and BL1b are charged to Vcc/2, a potential equal to that on the power supply node Nv. In accordance with the equalizing signal EQ, the NMOS transistors 24a and 24b in the precharging sections 24 are turned on, and the sense amplifier common nodes Nsn and Nsp are also charged to Vcc/2, a potential equal to the potential on the power supply node Nv. The word lines WL1 and WL2 are at the ground potential Vss, so the NMOS transistors 11 in the memory cells 10-1 and 10-2 are off, and the storage nodes Nm hold the information. Assume for the purpose of the following explanation, that, during read operation period, when for instance the word line WL1 is selected and charged to Vcc+Vth (Vth represents the threshold voltage of the NMOS transistor), and the data "1" (=Vcc) on the storage node Nm in the memory cell 10-1 is read.

In the operation of reading from the memory cell 10-1, if the word line WL1 is charged to Vcc+Vth after the equalizing signal EQ is changed to the Low (=Vss) level, the NMOS transistor 11 in the memory cell 10-1 is turned on, and bit line BL1a and the storage node Nm are connected to each other, and the bit line BL1a is raised to Vcc/2+$\alpha$, and the bit line BL1b is maintained at Vcc/2.

By discharging the sense amplifier common node Nsn from the Vcc/2 level to the Vss level, the first sense amplifier 21 is activated. At the same time, the sense amplifier common node Nsp is charged from the Vcc/2 level to the Vcc level, to activate the second sense amplifier 22. The potential difference $\alpha$ between the bit lines BL1a and BL1b is thereby amplified. As a result, the line BL1b is discharged to the Vss level, and the bit line BL1a is charged to the Vcc level. As a result, at the time of termination of the sense amplifier operation, the bit line BL1a will be at the Vcc level, and the bit line BL1b will be at the Vss level, and the storage node Nm is again charged to the Vcc level through the NMOS transistor 11 in the memory cell 10-1.

The memory information read onto the bit lines BL1a and BL1b are passed through a transfer gate selected by a column decoder, not shown, to a data bus, and the information on the data bus is transferred through an output buffer to the outside, and the reading is thus completed.

In the subsequent stand-by period, the word line WL1 is discharged to the Vss level, and the NMOS transistor 11 in the memory cell 10-1 is turned off, and the storage node Nm is made in the holding state. The equalizing signal EQ is thereafter raised to the High level (=Vcc) and the NMOS transistors 23a, 23b, 24a and 24b are turned on and the bit lines BL1a and BL1b and the sense amplifier common nodes Nsn and Nsp are again charged to Vcc/2 to be ready for next cycle of operation.

During writing operation, in contrast to the reading operation shown in FIG. 2, external information, not shown, is transferred through an input buffer to the data bus, and the information on the data bus is transferred through the transfer gate selected by the column decoder to the bit lines BL1a and BL1b, the information on the bit line BL1a is written through the NMOS transistor 11 in the memory cell 10-1 onto the storage node Nm. Through this process, the external information is stored in the memory cell 10-1.

In this type of conventional DRAM, when using the DRAM, if the user wanted to clear all the information that has been previously stored (erase the information in the memory cells to the physical "0"), it was necessary to write the physical "0" bit by bit or to wait until the information in the memory cells vary to the physical "0" due to the natural discharge of the memory cells themselves. Writing the physical "0" bit by bit however is time consuming, and the control procedure is complicated. Waiting until the natural discharge also takes time, and retards future accessing of the memory until the discharge is completed.

SUMMARY OF THE INVENTION

The present invention provides a semiconductor memory device which solves the problems of the initialization of the memory information being complex and the time required for initialization being long.

In order to solve these problems, the invention, in a first embodiment, provides a semiconductor memory device comprising a plurality of memory cells connected at the intersections of a plurality of pairs of bit lines and a plurality of word lines, a plurality of sense amplifiers activated by the potentials on the common nodes to sense and amplify the potential differences between the respective pairs of the bit lines, an equalizing section activated by the equalizing signal to apply the potential on the power supply node to the bit line pairs, a reference potential supplying section for generating a reference potential and supplying the reference potential to the power supply node through a switching section, and a negative potential input section for inputting an external signal of a negative potential and turning off the switching section and supplying the external signal to the power supply node.

The invention, in a second embodiment, employs, in place of the negative potential input section used in the first embodiment of the invention, a negative potential supplying section capable of being selectively made active or inactive and producing, when active, a negative potential, and supplying it to the power supply node, and a control section which is responsive to a control signal, for turning off the switching section and activating the negative potential supplying section.

In a third embodiment of the invention, the control section may be used in conjunction with a high potential detecting section, which detects application of a high potential signal at its external input terminal, and supplies, upon detection of such a high potential signal, the control signal to the control section.

According to the first embodiment of the invention as described above, when an external signal with a negative potential is input to the negative potential input section at the time of stand-by, the negative potential input section turns off the switching section in the reference potential supplying section and blocks the reference potential supplied from the reference potential supplying section, and supplies the external signal with the negative potential to the power supply node. Then, by means of the equalizing section activated by the equalizing signal, the negative potential on the power supply node is applied to the pair of bit lines, with the word lines being held at the ground potential, and all the memory cells connected to the pair of bit lines are simultaneously set to the physical "0" state. The initialization of all the memory cells is achieved simply and in a short time. After the initialization, access to the semiconductor memory device is enabled.

In the second embodiment of the invention, when the control signal is input to the control section, the control section turns off the switching section and blocks the reference potential output from the reference potential supplying section, and activates the negative potential supplying section. Then, the negative potential supplying section generates a negative potential and supplies it to the power supply node. Accordingly, in the same way as in the first embodiment of the invention, the negative potential on the power supply node is applied to each pair of bit lines, and all the memory cells are set to the physical "0" state.

In the third embodiment of the invention, with the provision of the high potential detecting section, when the high potential is applied to the external terminal, the high potential detecting section detects it and applies the control signal to the control section, which thereby operates as described above.

When the high potential ceases to be applied to the external terminal, the application of the control signal to the control section is terminated, and normal memory access operation can be started.

These embodiments of the invention thereby solve the previously mentioned problems associated with initialization of the memory information.

DETAILED DESCRIPTION OF THE PREFERRED EMBODIMENTS

Figure 3:
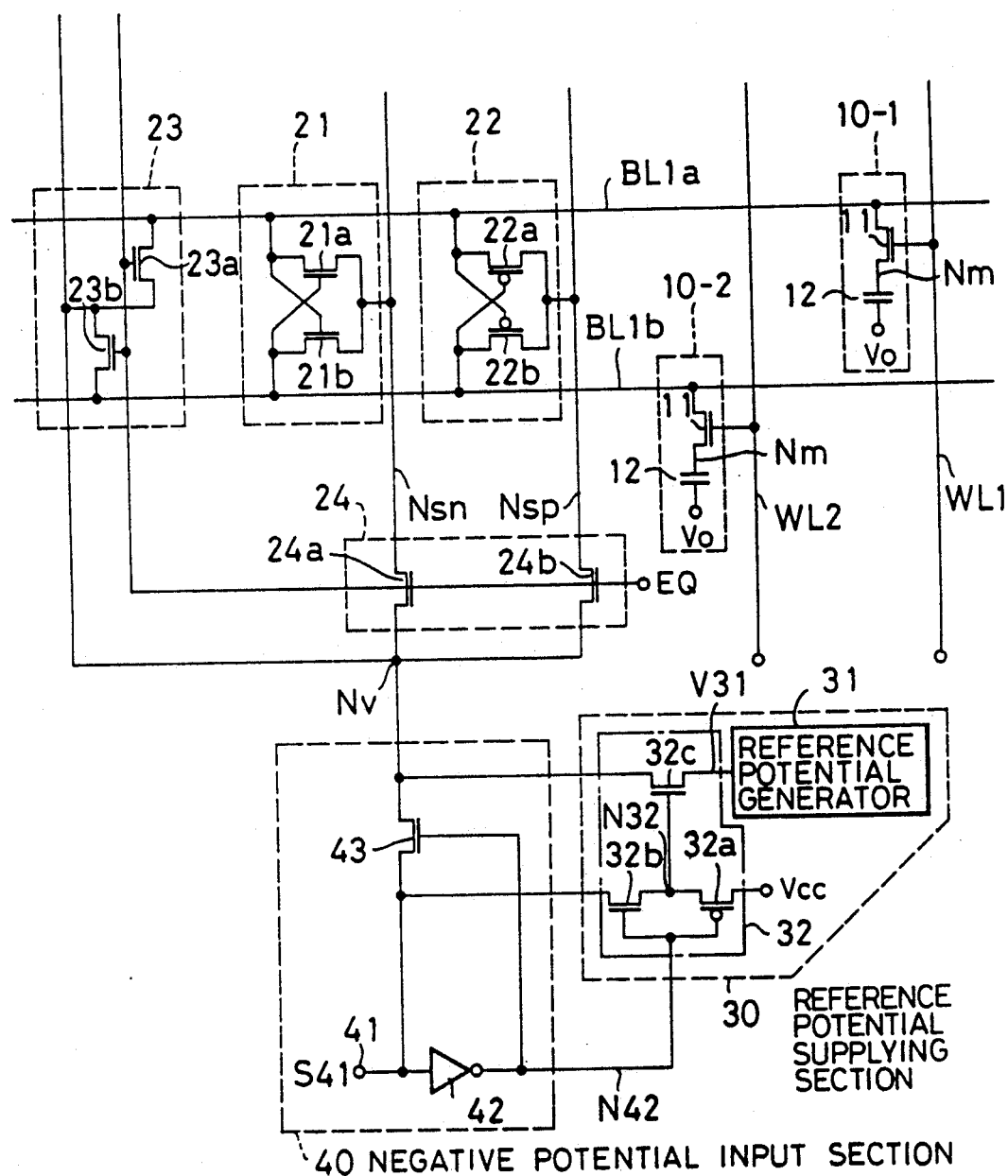
FIG. 3 is a circuit diagram showing a pertinent portion of a DRAM of an embodiment of the present invention.

FIG. 3 shows a first embodiment of the invention. It is a circuit diagram showing an example of configuration of memory cell and sense amplifier systems in a DRAM formed of CMOS. The elements identical to those in FIG. 1 are given identical reference numerals.

Figure 1:
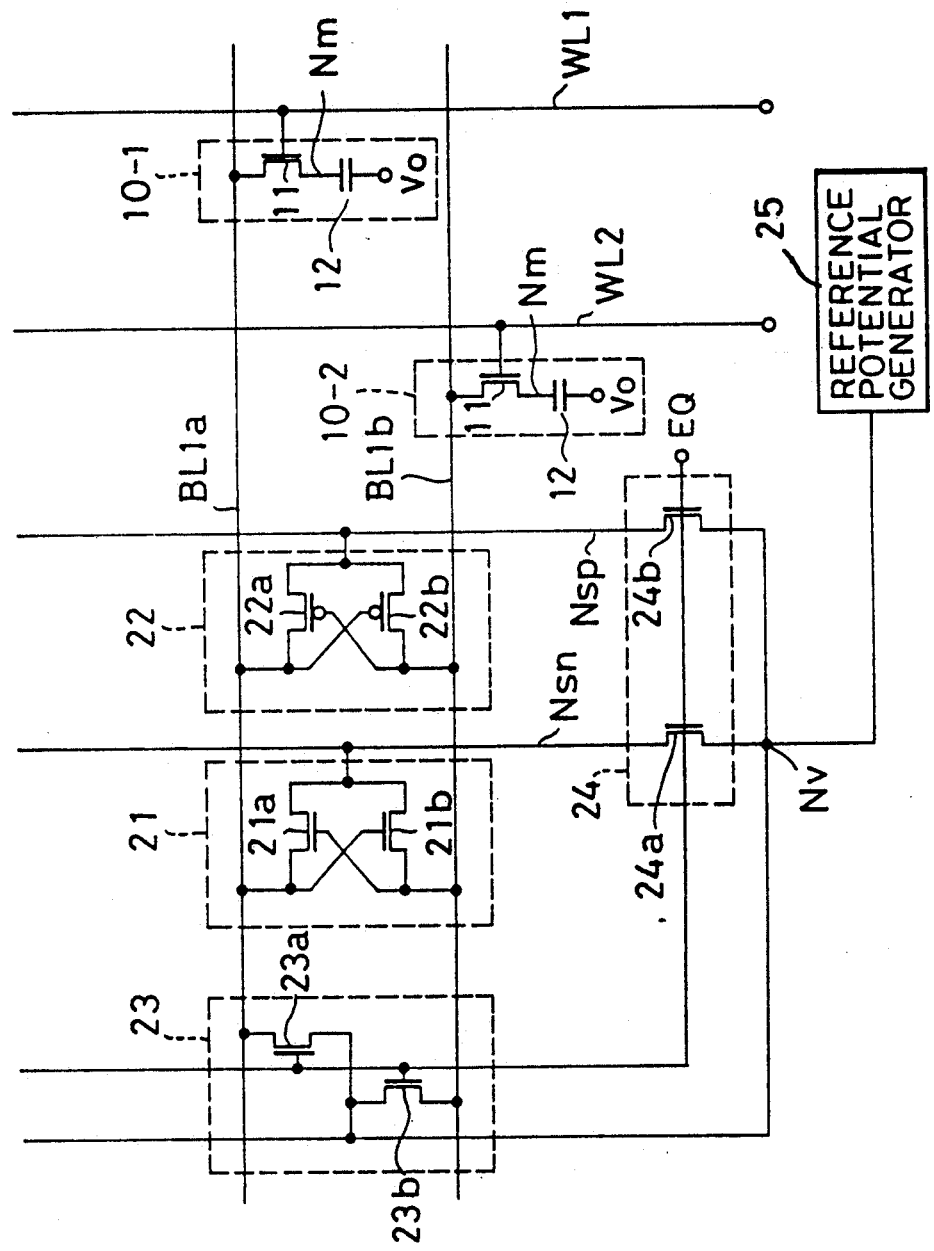
FIG. 1 is a circuit diagram showing a pertinent portion of a conventional DRAM.

The differences between this DRAM and the DRAM shown in FIG. 1 is the provision of a reference potential supplying section 30 and a negative potential input section 40 in place of the conventional reference potential generator 25. Both of these new section are connected to the power supply node Nv.

The reference potential supplying section 30 comprises a reference potential generator 31 generating a reference potential V31 (e.g., Vcc/2), and a switching section 32 for supplying or blocking the output of the reference potential generator 31. The switching section 32 comprises a PMOS transistor 32a and NMOS transistors 32b and 32c. The PMOS transistor 32a and NMOS transistor 32b are connected in series via the node N32 and are located between the external power supply potential Vcc and the external input terminal 41, and their gates are commonly connected to the node N42. The node N32 is connected to the gate of the NMOS transistor 32c, and the source and drain of the NMOS transistor 32c are connected to the output of the reference potential generator 31 and the power supply node Nv.

The negative potential input section 40 turns on and off the switching section responsive to the external signal S41 input from the external input terminal 41, and supplies the external signal S41 to the power supply node Nv, complementally with respect to the on/off operation of the switching section 32. The term "complementally" means that the external signal S41 is supplied to the power supply node Nv when the switching section 32 is off, and the external signal S41 is not supplied to the power supply node Nv when the switching section 32 is on. The negative potential input section 40 comprises an external input terminal 41, the CMOS inverter 42 and the NMOS transistor 43. The external input terminal 41 is connected to the input of the inverter 42, and the drain of the NMOS transistor 43, and to the source (or drain) of the NMOS transistor 32b in the switching section 32. The output node N42 of the inverter 42 is connected to the gate of the NMOS transistor 43 and to the gates of the PMOS transistor 32a and the NMOS transistor 32b in the switching section 32. The source of the NMOS transistor 43 is connected to the power supply node Nv and to the source (or drain) of the NMOS transistor 32c in the switching section 32.

Figure 4:
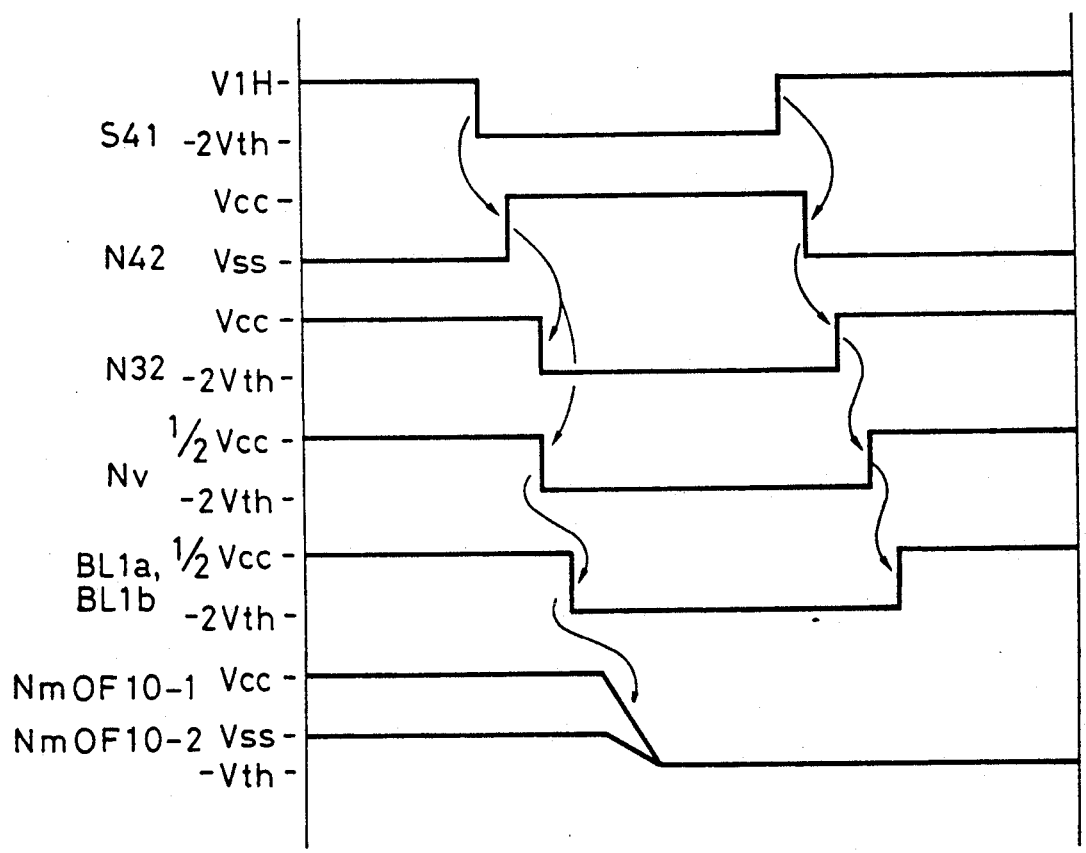
FIG. 4 is a timing diagram for the circuit illustrated in FIG. 3.

The operation of the DRAM shown in FIG. 3 will now be described with reference to FIG. 4.

The simultaneous clearing of all the memory cells in the invention is conducted in the stand-by period. This can be conducted by applying the Low level signal S41 of a negative potential (of for instance $-2$ Vth) to the external input terminal 41.

When, in the stand-by period, the external signal S41 applied to the external input terminal 41 in the negative potential input section 40 is at Low level ($-2$ Vth), the output node N42 of the inverter 42 is made High. The NMOS transistor 43 is then turned on and, through the NMOS transistor 43, the power supply node Nv is set to the same potential of $-2$Vth as the external input terminal 41. Since the node N42 is High, the PMOS transistor 32a in the switching section 32 is off, and the NMOS transistor 32b is on, and the node N32 is set to $-2$ Vth through the NMOS transistor 32b, and the NMOS transistor 32c in the switching section 32 is off.

The potential of $-2$ Vth on the power supply node Nv is transmitted through the NMOS transistors 23a and 23b and the NMOS transistors 24a and 24b to the bit lines BL1a and BL1b and the sense amplifier common nodes Nsn and Nsp, which are thereby set to $-2$ Vth level. The word lines WL1 and WL2 are held at the ground level Vss, so the NMOS transistor 11 in each of the memory cells 10-1 and 10-2 is turned on and the storage node Nm in each of the memory cells 10-1 and 10-2 is set at the physical "0" state ($-$Vth level which is lower than Vss level).

Next, when the external signal applied to the external input terminal 41 is made TTL (transistor-transistor logic) High, the output node N42 of the inverter 42 is made Low, and the NMOS transistor 43 is turned off. Then, the PMOS transistor 32a in the switching section 32 is on and the NMOS transistor 32b is off, so the node N32 is set to the same level as the external power supply potential Vcc. As a result, the NMOS transistor 32c is turned on, and, by virtue of the reference potential V31 (Vcc/2) output from the reference potential generator 31, the power supply node Nv is charged. Through the NMOS transistors 23a, 23b, 24a and 24b which are turned on by virtue of the equalizing signal EQ, the bit lines BL1a and BL1b, and the sense amplifier common nodes Nsn and Nsp are charged to Vcc/2.

Figure 2:
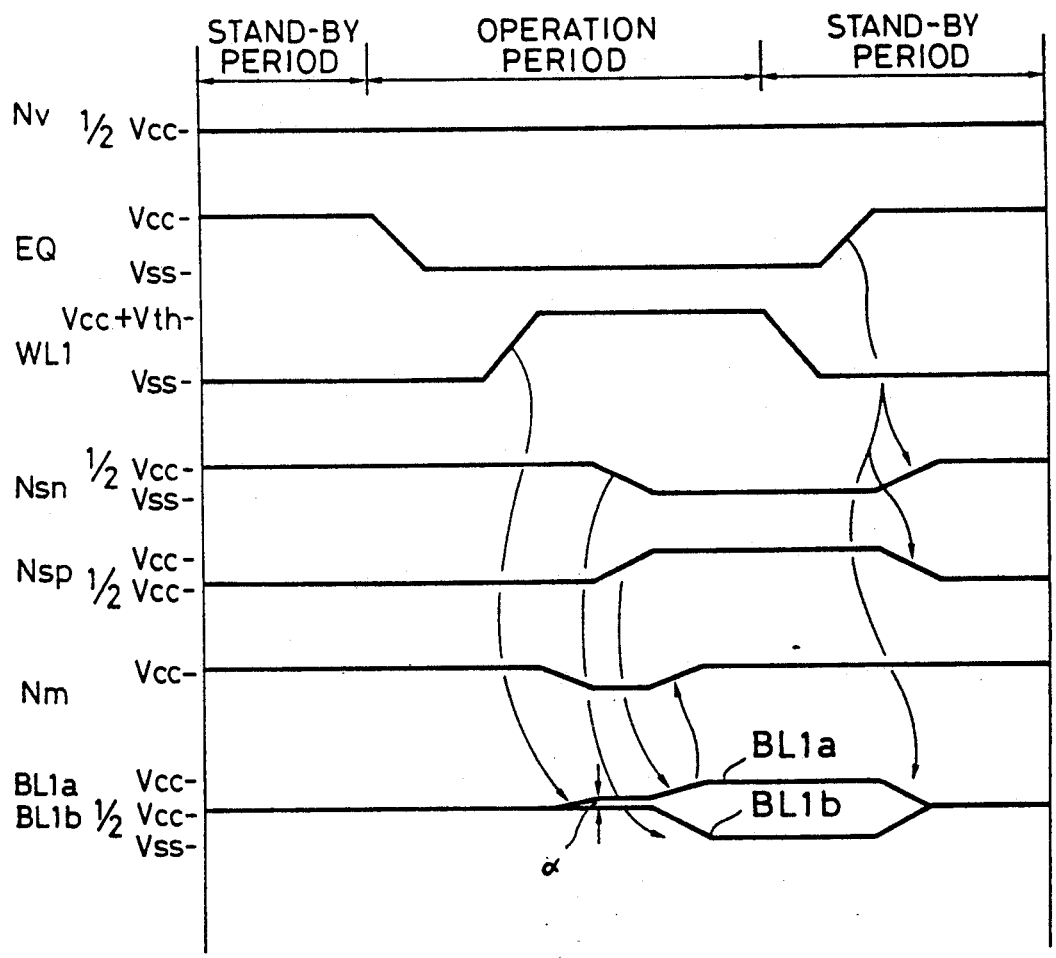
FIG. 2 is a timing diagram of a read operation for the circuit illustrated in FIG. 1.

When the external signal S41 is TTL High, the operation which takes place in the stand-by period and the read/write operation period when the Vcc/2 is applied to the power supply node Nv is identical to that of the conventional DRAM shown in FIG. 2. According to the first embodiment, therefore, without interfering with the operation of the conventional DRAM, by setting the external signal S41 to the Low ($-2$ Vth) level during stand-by period, the storage nodes Nm in the memory cells 10-1 and 10-2 can be set to the physical "0" state ($=-$Vth), simply and quickly.

Figure 5:
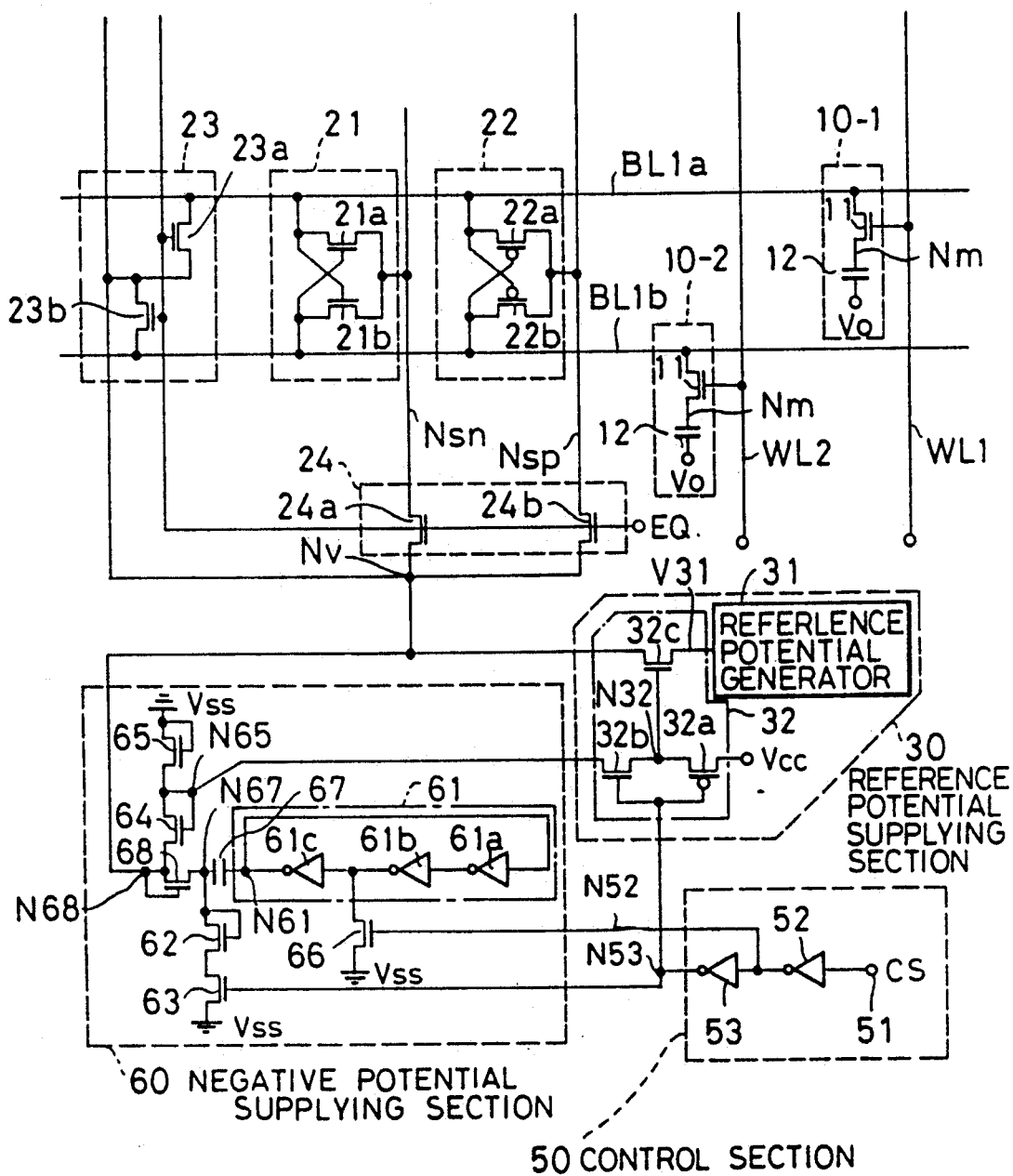
FIG. 5 is a circuit diagram showing a pertinent portion of a DRAM of a second embodiment of the invention.

FIG. 5 is a circuit diagram showing an example of a configuration of memory cell and sense amplifier systems in a DRAM of a second embodiment of the invention. Elements identical with those in FIG. 3 are given identical reference numerals.

The difference of this DRAM from the DRAM of FIG. 3 is that the negative potential input section 40 in FIG. 3 is replaced by a control section 50 and a negative potential supplying section 60, and the output of the negative potential supplying section 60 is connected to the power supply node Nv.

The negative potential supplying section 60 is capable of being selectively made active and inactive. When it is active, it produces a negative potential of $-2$ Vth. In the illustrated embodiment, the negative potential supplying section 60 oscillates to produce the negative potential.

The control section 50 turns on and off the switching section 32 in the reference potential supplying section 30 in accordance with the control signal CS of the TTL High or Low level input from the outside, and controls, complementally with respect thereto, the oscillation of the negative potential supplying section 60. The control section 50 has a control terminal 51 for inputting the control signal CS, and connected to the control terminal 51 are CMOS inverters 52 and 53 cascaded with each other. The output node N52 of the inverter 52 is connected to the negative potential supplying section 60, and the output node N53 of the inverter 53 is connected to the gates of the PMOS transistor 32a and NMOS transistor 32b in the switching section 32, and connected to the negative potential supplying section 60.

The oscillation of the negative potential supplying section 60 is controlled in accordance with the potentials on the output nodes N52 to N53 on the output side of the control section 50, and by virtue of the oscillation, a negative potential is supplied to the power supply node Nv.

The negative potential supplying section 60 includes an oscillator circuit which comprises a ring oscillator 61 consisting of three stages of CMOS inverters 61a, 61b and 61c, and NMOS transistors 62 to 66, and 68, and a MOS capacitor 67 connected as illustrated, and is capable of being on/off controlled. More specifically, the inverters 61a, 61b and 61c forming the ring oscillator are cascaded in the stated order, and the output of the last inverter 61c is connected to the input of the first inverter 61a. The period of oscillation is twice the propagation delay time for one complete round through the ring oscillator.

The output of the inverter 61b within the ring oscillator 61 is connected via the NMOS transistor 66 to the ground potential Vss, and the gate of the NMOS transistor 66 is connected to the output node N52 of the control section 50 for on/off control of the ring oscillator 61.

The output of this ring oscillator 61 is at node N61, which is coupled by a coupling capacitor 67 to another node N67. The node N67 is connected via series-connected NMOS transistors 62 and 63 to the ground potential Vss. More specifically, the output node N67 is connected to the drain and gate of the NMOS transistor 62. The source of the NMOS transistor 62 is connected to the drain of the NMOS transistor 63, whose source is grounded. The gate of the NMOS transistor 63 is connected to the output node N53 of the control section 50.

The node N67 is connected via the NMOS transistor 68, having its gate connected to the source, to the output node N68 of this negative potential supplying section 60. The output node N68 is connected via the series-connected potential clamping NMOS transistors 64 and 65, having their gate and drain connected together, to the ground potential Vss. The node N65 connected to the source and gate of the NMOS transistor 64 is connected to the source (or drain) of the NMOS transistor 32b within the switching section 32. The output node N68 is connected to the power supply node Nv.

The capacitor 67, the transistors 62 to 65 and 68 in combination form a pumping circuit responsive to an AC signal to produce a signal of a DC level beyond the potentials of the power supply energizing the circuit. The NMOS transistors 62, 64, 65 and 68 serve as rectifiers providing certain constant forward voltage drops, their drain acting as an anode and their source acting as a cathode. These transistors may therefore be called rectifying transistors. In addition, the series-connected transistors 64 and 65 in combination may be regarded "as a rectifier". The term "rectifier" and "rectifier circuit" as used in the appended claims should be construed to cover both a circuit consisting of a single rectifying transistor as well as a circuit consisting of a plurality of rectifying transistors connected in series with each other. The transistors 63 and 66 on the other hand serve as switching transistors.

Figure 6:
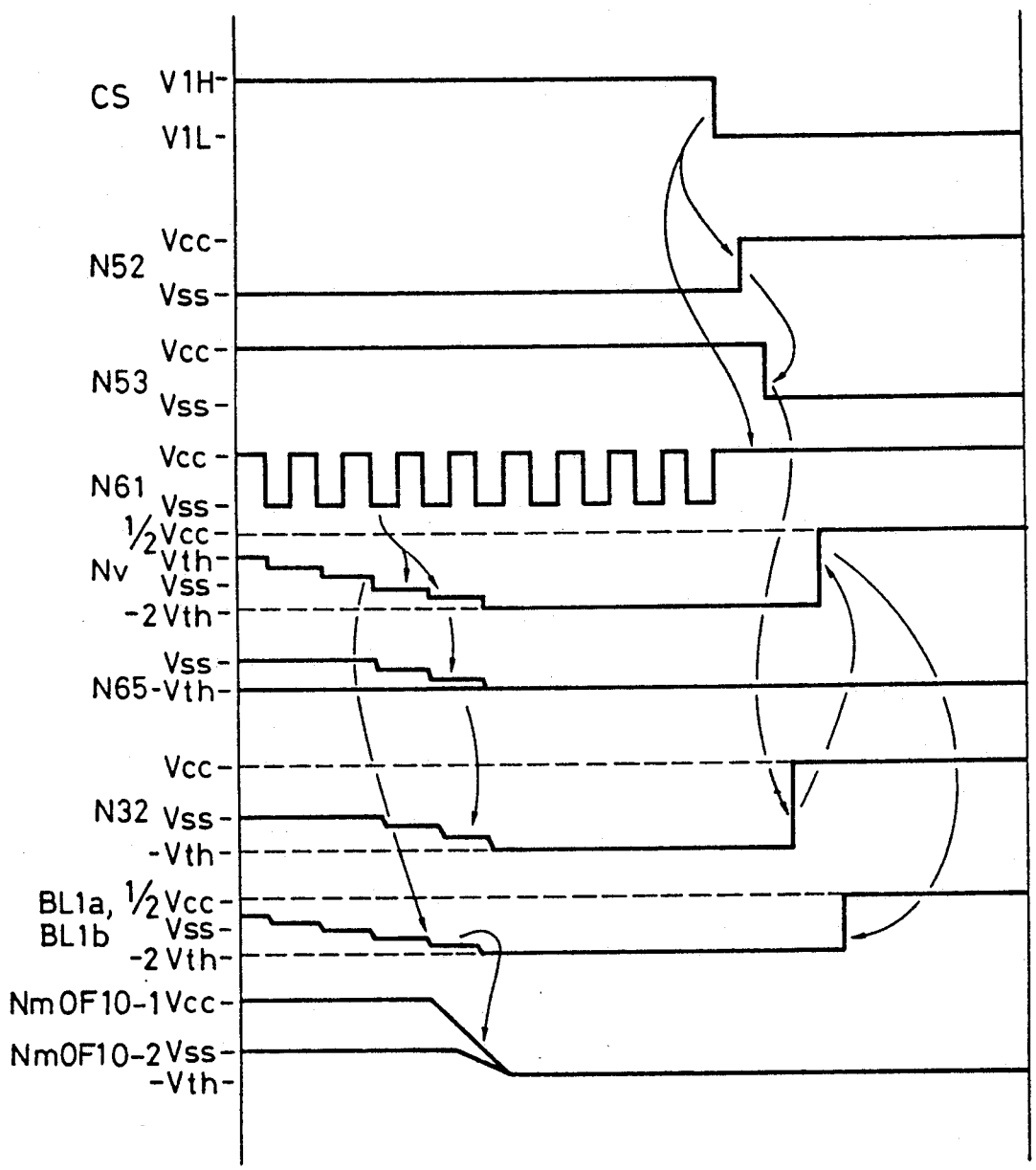
FIG. 6 is a timing diagram for the circuit illustrated in FIG. 5.

The operation of the DRAM shown in FIG. 5 will now be described with reference to FIG. 6.

When the control signal CS applied to the control terminal 51 in the control section 50 is made TTL High, in the stand-by period, the output node N52 is made Low, and the output node N53 is made High.

When the output node N53 is made High, the PMOS transistor 32a within the switching section 32 is turned off, and the NMOS transistor 32b is turned on, and, via the NMOS transistor 32b, the node N32 is fixed to −Vth, the same level as the node N65, and the NMOS transistor 32c is turned off and the supply of the reference potential V31 output from the reference voltage generator 31 is blocked.

When the output node N52 is made Low, the NMOS transistor 66 in the negative potential supplying section 60 is turned off, and the ring oscillator 61 begins oscillating, and consecutive pulses oscillating between the High (Vcc) and Low (Vss) levels are generated at the output node N61 of the ring oscillator 61.

Since the output node N53 of the control section 50 is High, the NMOS transistor 63, whose drain being fixed to the ground potential Vss, is turned on. For this reason, the potential on the output node N67 is restrained so that it is not higher than the threshold voltage $V_{t62}$ of the NMOS transistor 62, and the potential on the node N67 oscillates between $V_{t62}$ and ($V_{t62} - Vcc$). This potential on the node N67 is transmitted via the NMOS transistor 68 to the node N68, which is connected to the power supply node Nv. The NMOS transistor 68 therefore tends to restrain the potential on the node N68 not to be higher than ($V_{t62} - Vcc + V_{t68}$), with $V_{t68}$ being the threshold voltage of the NMOS transistor 68. On the other hand, the series-connected NMOS transistors 64 and 65 tend to restrain the potential on the output node N68 not to be lower than $-(V_{t64} + V_{t65})$, with $V_{t64}$ and $V_{t65}$ being the threshold voltages of the NMOS transistors 64 and 65. The overall effect is that the potential on the node N68 is restrained between $-(V_{t64} + V_{t65})$ and ($V_{t62} - Vcc + V_{t68}$). The actual potential at the node N68 is determined by the conductances of the NMOS transistors 64, 65, 68 and 62. If the conductances of the NMOS transistors 64 and 65 are sufficiently larger than the conductances of the NMOS transistors 68 and 62, the potential at the node N68 is substantially at $-(V_{t64} + V_{t65})$. If $V_{t64} = V_{t65} = Vth$, then the potential at the node N68 is stabilized at $-2Vth$, as illustrated in FIG. 6.

The source node N65 of the NMOS transistor 64 is stabilized at $-V_{t65}$ or $-Vth$.

The power supply node Nv can thus be ultimately stabilized at $-2Vth$, via the capacitor 67 and by the action of the potential clamping NMOS transistors 64 and 65. As a result, via the NMOS transistors 23a, 23b, 24a and 24b that are on by virtue of the equalizing signal EQ, the bit lines BL1a and BL1b, and the sense amplifier common nodes Nsn and Nsp are discharged to $-2Vth$, the same as the power supply node Nv. The word lines WL1 and WL2 are held at the ground potential Vss during stand-by, and the NMOS transistors 11 in the memory cells 10-1 and 10-2 are thereby turned on, and the storage nodes Nm are ultimately discharged to $-Vth$. The same operation takes place in regard to all other memory cells, so the storage nodes Nm in the memory cells 10-1 and 10-2 are initialized to the physical "0" level.

Also in the stand-by period, when the control signal CS applied to the control terminal 51 is changed to the TTL Low level, the output node N52 is made High, via the inverter 52, and the output node N53 is made Low, via the inverter 53.

When the output node N52 is made High, the NMOS transistor 66 is turned on, the output of the inverter 61b in the ring oscillator 61 is fixed to Vss level, and the oscillation of the ring oscillator 61 is terminated. Because the output node N53 of the control section 50 is Low, the PMOS transistor 32a is on and the NMOS transistor 32b is off, and the node N32 is charged to the power supply potential Vcc level via the PMOS transistor 32a. As a result, the NMOS transistor 32c is on and the reference potential V31 (Vcc/2) output from the reference potential generator 31 is supplied to the power supply node Nv. For this reason, via the NMOS transistors 23a, 23b, 24a and 24b, the bit lines BL1a and BL1b, and the sense amplifier common nodes Nsn and Nsp are set to Vcc/2 level. Accordingly, the operation similar to that of the conventional DRAM is performed.

As in the first embodiment, in this second embodiment as well by inputting the control signal CS of the TTL High level to the control terminal 51 during the stand-by period, it is possible to set the storage nodes Nm in the memory cells 10-1 and 10-2 to the physical "0" state, without interfering with the operation of the conventional DRAM.

Figure 7:
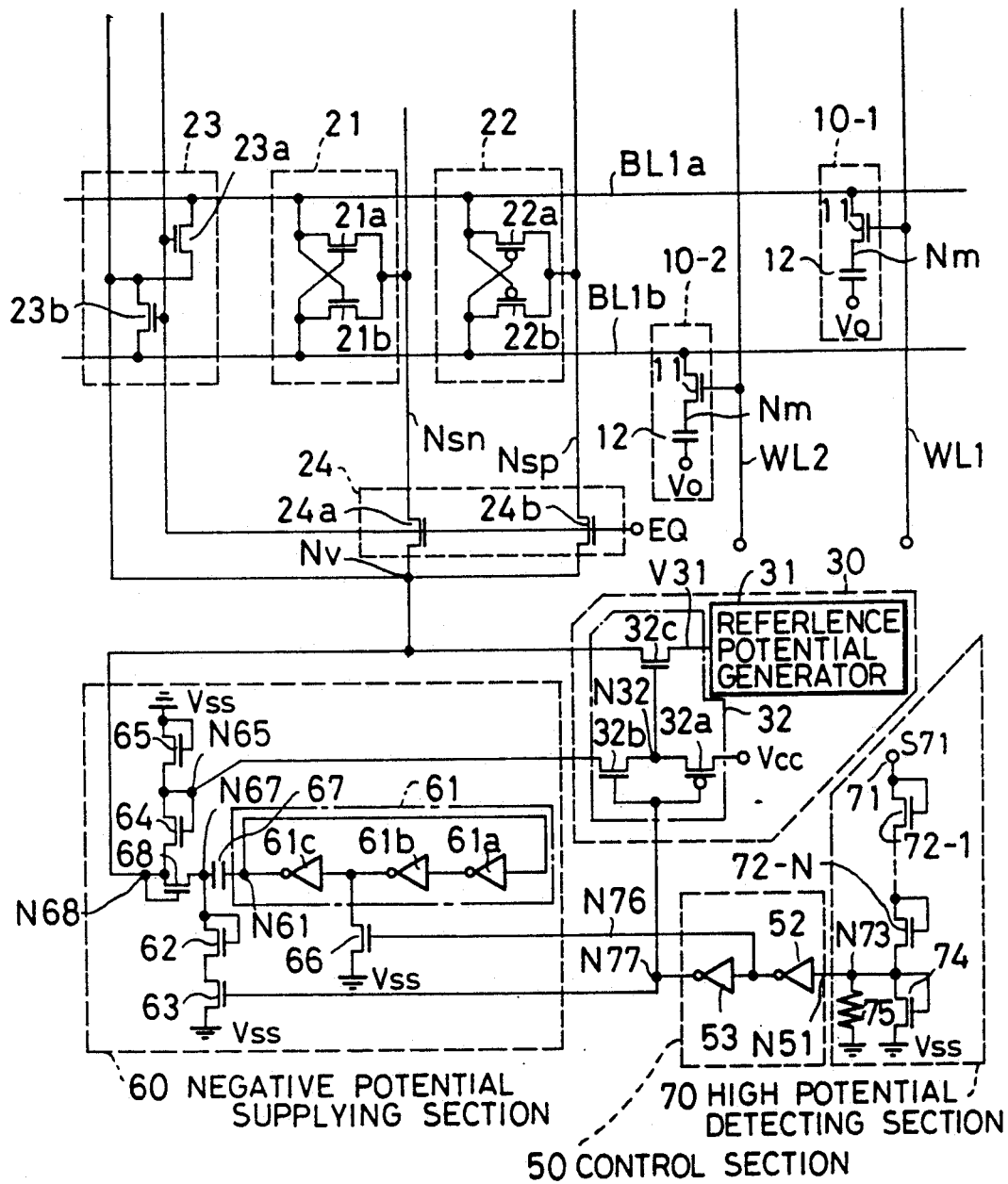
FIG. 7 is a circuit diagram showing a pertinent portion of a DRAM of a third embodiment of the invention.

FIG. 7 is a circuit diagram showing memory cell and sense amplifier systems in a DRAM of a third embodiment of the invention. Elements identical to those in FIG. 5 are given identical reference numerals.

The difference of this DRAM from that of FIG. 5 is that the control section 50 is associated with a high potential detecting section 70, from which it receives the control signal CS.

The high potential detecting section 70 detects application of a high potential signal S71 at its external terminal 71, and supplies, upon detection of the high potential signal S71, the control signal CS to the control section.

The illustrated high potential detecting section 70 comprises a plurality of series-connected NMOS transistors 72-1 to 72-N, and 74 each having its gate and drain connected together. The series-connected NMOS transistors 72-1 to 72-N and 74 are connected across the external input terminal 71 and the ground potential Vss. The drain of the NMOS transistor 74, and hence the source of the NMOS transistor 72-N are connected to the output node N73 of the high potential detecting section 70, and are connected via a resistor 75 to the ground potential Vss. The output node N73 is connected to the input terminal N51 of the control section 50, and the control signal CS is thus supplied from the high potential detecting section 70 to the control section 50 via these nodes N73 and N51.

Figure 8:
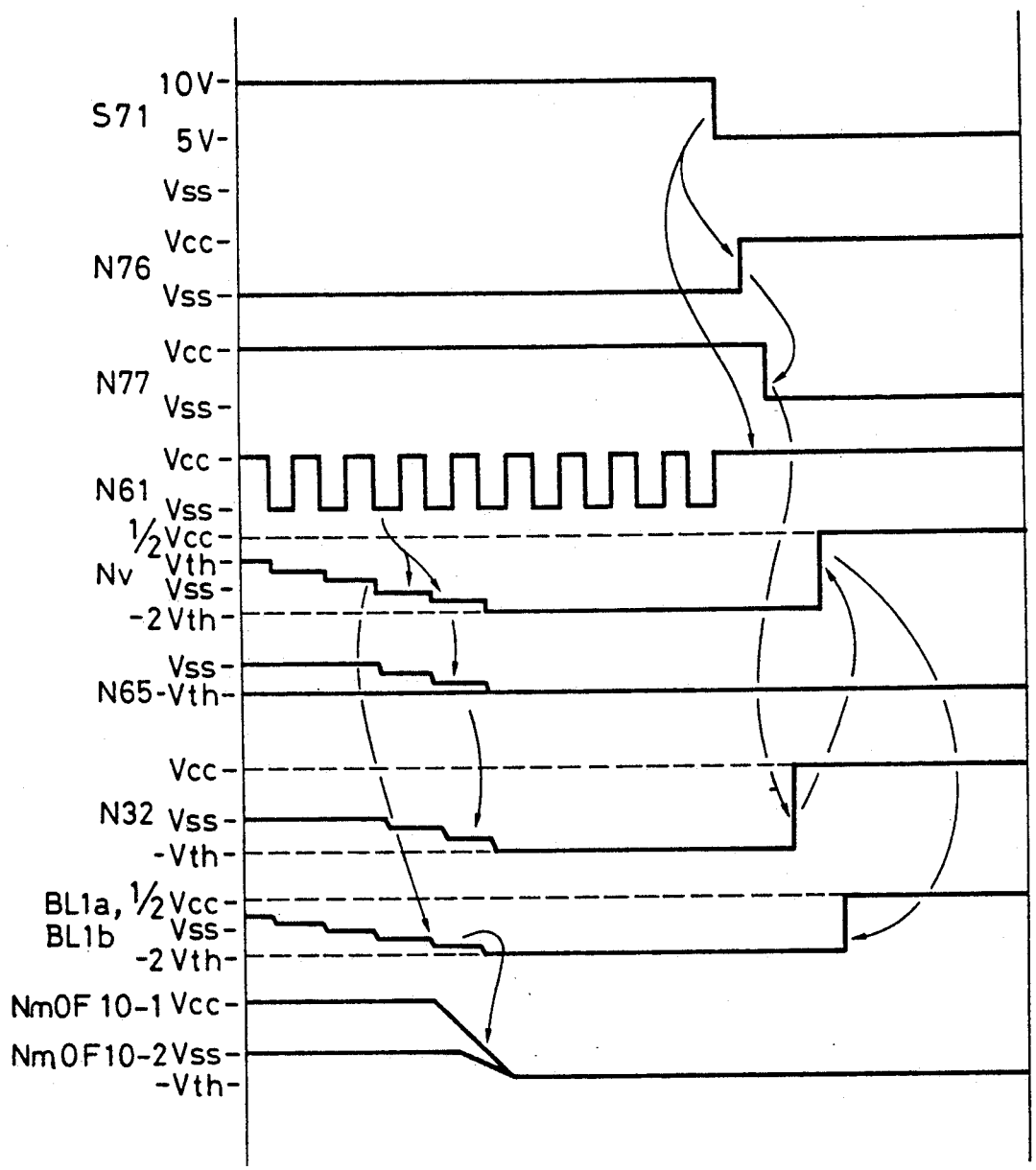
FIG. 8 is a timing diagram for the circuit illustrated in FIG. 7.

The operation of the DRAM shown in FIG. 7 will be made with reference to FIG. 8.

The parameters of the NMOS transistors 72-1 to 72-N and 74 and the resistor are so set that, when the external signal S71 of a high potential (e.g., 10 V) exceeding predetermined level is applied, in the stand-by period, to the external input terminal 71, the series-connected NMOS transistors 72-1 to 72-N and 74 are all turned on and the output node N73 becomes High for the inverter 52. In other words, the control signal CS as applied to the control section is Active or High. The above-mentioned predetermined level is set to be higher than the external power supply potential Vcc (e.g., 5 V). This means that during normal read/write operation, the terminal 71 can be used for inputting or outputting a signal of the logic level (which is within the range of from Vcc to Vss).

In other respects, the systems of FIG. 7 operate in the same way as the embodiment of FIG. 5.

By arranging that, if an external signal S71 of the same level as or less than the external power supply potential Vcc is applied to the external input terminal 71 during the stand-by period, the NMOS transistor 72-N in the series circuit of the NMOS transistors 72-1 to 72-N and 74 is turned off, the output node N73 of the series circuit is fixed to Vss level via the resistor 75. As a result the control signal CS is Low.

The external input terminal 71 is preferably an open terminal, i.e., is not shunted with any other terminal. It may however be shunted with other external input pins of a DRAM (e.g., address terminal, row address strobe signal terminal $\overline{\text{RAS}}$, column address strobe signal terminal $\overline{\text{CAS}}$, write enable signal terminal $\overline{\text{WE}}$, and the like).

The present invention is not limited to the embodiments described above, but the memory cell and sense amplifier systems may be of other circuit configurations, or the reference potential supplying section 30, the negative potential input section 40, the control section 50 and the high potential detecting section 70, and the negative potential supplying section 60 may have configurations other than those illustrated. The present invention can be applied to semiconductor memory devices other than DRAMs. Various other modifications are possible.

As has been described in detail, according to the embodiment of FIG. 3, the reference potential supplying section and the negative potential input section are provided, and by inputting the external signal of a negative potential, the reference potential from the reference potential supplying section is blocked, and the input external signal is supplied via the negative potential input section to the power supply node. Accordingly, by inputting the external signal of a negative potential, the memory cells are simply and quickly initialized to the physical "0"state, and an efficient simultaneous erasure can be achieved.

In the embodiment of FIG. 5, the reference potential supplying section, the negative potential supplying section, and the control section are provided, so by inputting the control signal, the reference potential from the reference potential supplying section is blocked, and the negative potential generated by the negative potential supplying section is supplied to the power supply node, and in the same way as in the first embodiment, all the memory cells are initialized to the physical "0" state simply and quickly, so an efficient simultaneous erasure can be achieved.

According to the third embodiment of FIG. 7, in addition to the reference potential supplying section, the negative potential supplying section and the control section, which are also provided in the second embodiment, the high potential detecting section is provided, so by inputting a high potential, supply of the control signal is supplied to the control section, and an operation similar to that in the embodiment of FIG. 5 is then conducted. Because of the provision of the high potential detecting section, a terminal which can be used for other purposes during normal read/write operation can be also used for the input of the high potential signal commanding the clearing of all the memory cells.

What is claimed is:

1. A semiconductor memory device comprising:
   a plurality of memory cells connected at the intersections of a plurality of pairs of bit lines and a plurality of word lines;
   a plurality of sense amplifiers activated by the potentials on common nodes to sense and amplify the potential differences between the respective pairs of bit lines;
   an equalizing means activated by an equalizing signal to apply the potential on a power supply node to the pairs of bit lines;
   a reference potential supplying means for generating a reference potential and supplying the reference potential to the power supply node through a switching means; and a negative potential input means for receiving an external signal of a negative potential and turning off the switching means and supplying the external signal to the power supply node.

2. The device of claim 1, wherein
said reference potential supplying means further comprises a reference potential generator for supplying said reference potential;
said switching means permits application of said reference potential to said power supply node when said switching means is on, and blocks application of said reference potential to said power supply node when said switching means is off.

3. The device of claim 2, wherein said switching means comprises:
a first MOSFET coupling said reference potential generator and said power supply node;
a second MOSFET which is off when said external signal is active and which is on when said external signal is inactive; and
a third MOSFET which is off when said external signal is inactive and is on when said external signal is active;
said first MOSFET is on when said second MOSFET is on and said third MOSFET is off, and is off when said second MOSFET is off and said third MOSFET is on.

4. The device of claim 1, wherein said negative potential input means comprises an inverter receiving said external signal and producing an inversion signal of said input signal and means for applying said inversion signal to said switching means of said reference potential supplying means.

5. The device of claim 3, wherein said negative potential input means comprises a switching means which is turned on by said inversion signal to permit application of said external signal to said power supply node.

6. A semiconductor memory device comprising:
a plurality of memory cells connected at the intersections of a plurality of pairs of bit lines and a plurality of word lines;
a plurality of sense amplifiers activated by the potentials on common nodes to sense and amplify the potential difference between the respective pairs of the bit lines;
an equalizing means activated by an equalizing signal to apply the potential on a power supply node to the pairs of bit lines;
a reference potential supplying means for generating a reference potential, and supplying the reference potential to the power supply node through a switching means;
a negative potential supplying means capable of selectively being made active or inactive and, when active, of supplying a negative potential to the power supply node; and
a control means which receives a control signal and which when said control signal is in a first state, turns off the switching means and makes the negative potential supplying means active, and, when said control signal is in a second state, turns on the switching means and makes the negative potential supplying means inactive.

7. The device of claim 6, wherein said negative potential supplying means comprises:
a ring oscillator;
a switching transistor which is on when said control signal is in said second state to prevent the oscillation of said ring oscillator and is off when said control signal is in said first state to permit the oscillation of said ring oscillator.

8. The device of claim 7, wherein said negative potential supplying means further comprises:
a coupling capacitor having a first electrode connected to an output node of said ring oscillator and a second electrode;
a first rectifier circuit having an anode connected to the second electrode of said capacitor;
a switching transistor having a drain connected to the cathode of the first rectifier circuit, and having a source grounded;
a second rectifier circuit having an anode grounded and a cathode;
a third rectifier circuit having an anode connected to the cathode of the second rectifier circuit and a cathode connected to the second electrode of the capacitor;
said cathode of said second rectifier circuit constituting the output node of the negative potential generating means connected to the power supply node.

9. The device of claim 8, wherein
said reference potential supplying means further comprises a reference potential generator for supplying said reference potential;
said switching means permits application of said reference potential to said power supply node when said switching means is on, and blocks application of said reference potential to said power supply node when said switching means is off.

10. The device of claim 9, wherein said switching means comprises:
a first MOSFET coupling said reference potential generator and said power supply node;
a second MOSFET which is off when said control signal is in said first state and which is on when said control signal is in said second state; and
a third MOSFET which is off when said control signal is in said second state and is on when said control signal is in said first state;
said first MOSFET is on when said second MOSFET is on and said third MOSFET is off, and said first MOSFET is off when said second MOSFET is off and said third MOSFET is on.

11. The device of claim 10, wherein said second rectifier circuit comprises a first rectifier having an anode grounded and a cathode, and a second rectifier having an anode connected to the cathode of the first rectifier and having a cathode connected to the power supply node; and the potential on said cathode of said first rectifier of said second rectifier circuit is used to turn off said first MOSFET of said switching means.

12. The device of claim 7, wherein
said control means comprises a first inverter receiving said control signal, and a second inverter receiving the output of said first inverter;
said ring oscillator is made to oscillate when the output of said first inverter is Low;
said switching means of said reference potential supplying means is off when the output of said second inverter is High; and
said switching transistor is on when the output of said second inverter is High.

13. The device of claim 6, further comprising:
a high potential detecting means which is responsive to a signal having a potential exceeding a range of potentials applied under normal read/write operating conditions, for bringing said control signal into said first state, and for bringing said control signal into said second state at other times.

* * * * *